(12) United States Patent
Baillin et al.

(10) Patent No.: US 8,367,929 B2
(45) Date of Patent: Feb. 5, 2013

(54) MICROCAVITY STRUCTURE AND ENCAPSULATION STRUCTURE FOR A MICROELECTRONIC DEVICE

(75) Inventors: Xavier Baillin, Crolles (FR); Stéphane Caplet, Sassenage (FR); Thierry Hilt, Barraux (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 276 days.

(21) Appl. No.: 12/848,386

(22) Filed: Aug. 2, 2010

(65) Prior Publication Data

US 2011/0030989 A1 Feb. 10, 2011

(30) Foreign Application Priority Data

Aug. 6, 2009 (FR) ..................... 09 55537

(51) Int. Cl.
 *H05K 5/00* (2006.01)
(52) U.S. Cl. ............. 174/50; 438/48; 257/730; 361/760
(58) Field of Classification Search ............ 174/50; 438/48, 127, 700; 257/730, 415; 361/760, 361/720, 736, 748
 See application file for complete search history.

(56) References Cited

U.S. PATENT DOCUMENTS

| | | | |
|---|---|---|---|
| 6,032,923 A | | 3/2000 | Biegelsen et al. |
| 7,429,495 B2* | | 9/2008 | Wan ................................ 438/53 |
| 7,635,901 B2 | | 12/2009 | Robert |
| 7,648,859 B2 | | 1/2010 | Robert |
| 8,071,413 B2* | | 12/2011 | Wang ............................... 438/50 |
| 2009/0090531 A1 | | 4/2009 | Schmitz et al. |

FOREIGN PATENT DOCUMENTS

| | | |
|---|---|---|
| EP | 1 694 597 B1 | 8/2006 |
| EP | 1 708 958 B1 | 10/2006 |
| WO | WO 2005/061374 A1 | 7/2005 |
| WO | WO 2005/061375 A1 | 7/2005 |
| WO | WO 2007/074017 A1 | 7/2007 |

OTHER PUBLICATIONS

Office Action issued May 19, 2010, in French Patent Application No. 095537 with English translation of category of cited documents.

* cited by examiner

*Primary Examiner* — Dhirubhai R Patel
(74) *Attorney, Agent, or Firm* — Oblon, Spivak, McClelland, Maier & Neustadt, L.L.P.

(57) ABSTRACT

A microcavity structure including: a first substrate, a cover attached to the first substrate such that a space formed between the cover and the first substrate forms the microcavity, at least one hole passing through the cover, and at least one closing flap of the hole placed inside the microcavity and including at least two portions of materials with different thermal expansion coefficients placed one against the other, at least one first end of the two portions being mechanically linked to the cover, at least a second end of the two portions being free, and at least a part of the closing flap being placed opposite the hole, the two portions being capable of closing or not the hole under the effect of a temperature variation.

18 Claims, 5 Drawing Sheets

MICROCAVITY STRUCTURE AND ENCAPSULATION STRUCTURE FOR A MICROELECTRONIC DEVICE

TECHNICAL AREA

The invention relates to microelectronics, and more particularly to the field of microcavity structures used, e.g. for packaging or encapsulating microelectronic devices e.g. of the type MEMS (Micro electro-mechanical systems) and/or NEMS (Nano electro-mechanical systems) and/or MOEMS (Micro opto-electro-mechanical systems) and/or NOEMS (Nano opto-electro-mechanical systems) to protect them from the external environment.

PRIOR ART

A first type of encapsulation method for the encapsulation of microelectronic devices consists of the transfer of a cover, formed by a substrate, on the support on which the devices are fabricated. This type of encapsulation method requires the machining of a cover prior to its assembly on the support. In order to control the atmosphere inside the microcavity, it is necessary to produce at the same time, a hermetic seal between the support and the cover, but also to deposit a thin film getter on the cover, generally at the bottom of the hollow, previously machined in the cover. The three modes of hermetic sealing the most used in microtechnology are metallic eutectic, direct and anodic. An anodic sealing only applies where there is a single assembly between a glass cover and a silicon support.

However, with this type of encapsulation procedure, even assisted by a getter deposited in the microcavity, it is difficult to attain a pressure less than about $10^{-3}$ mbar in the microcavity and therefore to control the residual atmosphere in the microcavity in which the microelectronic device is encapsulated.

A second type of encapsulation method of a microelectronic device, called "Thin Film Packaging" or TFP, consists of creating an encapsulating structure around the device, previously deposited on a substrate. This type of method is generally performed in a collective fashion for several microelectronic devices deposited on the same substrate and by the application of conventional techniques used in microelectronics.

Today, the most developed procedure to produce an encapsulation of type TFP involves depositing a sacrificial photosensitive resin onto the microelectronic devices, making them undergo a technical operation of photolithography, then a thermal shaping treatment, and finally the deposition of an encapsulation layer of a hermetic material, e.g. an oxide, onto the resin forming the cover. Three release holes are then pierced in the cover to form an access allowing the sacrificial resin to be etched. The release holes must then be filled to close the cavity. It is for this that they are of very small size, and that their placement and their number are imposed by the microelectronic device itself that must not be placed directly below these holes because of the subsequent plugging of the holes, performed to close the cavity. However, even when the microelectronic device is not placed directly below the holes, there is still a risk of damaging the device or of altering its proper operation due to the hole plugging material that can pollute the interior of the cavity and/or the device during the plugging of the holes.

The document EP 1 708 958 B1 describes a method of fabricating a hermetic microcavity in which a microcomponent is encapsulated. In this method, the cavity is closed by plugging the release holes formed through the cover, using external plugs. The plugs are made of a material able to be deformed by creep. The dimensions of the release holes, corresponding e.g. to the diameter or to the dimensions of the sides according to the cross-sectional form of the holes, are smaller than about 5 µm. The plugs are made of a polymerized material so as to avoid the material forming the plug entering the interior of the cavity during the deposit of the material on the cover. Thus, in addition to the difficulty of controlling the residual atmosphere of the cavity after the fabrication of these plugs, this method is not suitable for fabricating release holes with dimensions larger than 5 µm, nor for using materials other than a polymerized material for plugging the release holes.

The document EP 1 694 597 B1 describes a method of fabricating a hermetic microcavity in which a microcomponent is encapsulated. The microcavity can be closed from the outside by an external layer under mechanical tensile stress with a deflection towards the microcavity. Another external layer under mechanical compressive stress may be placed above the first layer in order to maintain open the microcavity during the release of the microcomponent. In another version, the microcavity may also be closed by a first external layer, which is non stressed or under weak compressive stress and covered, following the release of the microcomponent, by a second layer under tensile mechanical stress.

When the microcavity is closed by two layers under different mechanical stresses, the equilibrium of the mechanical stresses between the two layers must be perfectly adjusted. But such an adjustment is difficult to achieve. In addition, in the case where only one external layer under mechanical tensile stress is used for closing the microcavity, the duration of the release of the microcomponent (corresponding to the etching of the sacrificial material in the microcavity) is then very long. Finally, the addition of the second external layer following the release of the microcomponent also represents an important constraint.

DESCRIPTION OF THE INVENTION

Thus there is a need to propose a microcavity structure suitable for the encapsulation of at least one microelectronic device, which does not have the disadvantages of the prior art.

For that, one embodiment proposes a microcavity structure comprising at least:
- a substrate,
- a cover attached to the substrate such that a space formed between the cover and the substrate forms the microcavity,
- at least one hole passing through the cover, and
- at least one closing flap for the hole comprising at least two portions of materials with different thermal expansion coefficients placed one against the other, at least one first end of said two portions being mechanically linked to the cover, at least one second end of said two portions being free, and at least a part of the closing flap being placed opposite the hole. Said two portions may be suitable for closing or not the hole under the effect of a variation of temperature.

Such a structure comprises therefore, at least one closing flap, at least one part of which is placed directly above or in front of one or more release holes, and the actuating of which, that is to say the passage from a first position in which the flap does not plug one or more holes to a second position in which said part of the closing flap, placed in front of one holes or more holes, plugs said hole or holes, is obtained by means of a bimetallic thermal switch effect: under the effect of a change of temperature, the two portions of the metal with different thermal expansion coefficients deform to plug or open, one hole or more holes. It is thus possible to access the interior of the microcavity when the flap is not in a closing position of one or more holes, e.g. when the flap is held at a certain temperature, but also to plug one or more holes, e.g. hermetically, when the flap is held at another temperature (e.g. ambient temperature), which allows the plugging of one or more holes to be obtained without polluting the interior of the microcavity with the plugging material.

Given the presence of the closing flap, the dimensions of one or more of the holes formed through the cover may be larger than those of the holes made in covers of encapsulation structures in the prior art as there is no limitation on the plugging material that can be used to plug one or more holes. Thus, when a microelectronic device encapsulation is produced in such a structure, the release holes may be placed in such a way as to largely reduce the release time of the device, notably by placing them all over the surface of the cover, including directly above the device, the closing of them being ensured by one or a plurality of closing flaps. In addition, it is possible that the closing flap be placed directly above, or in front of several holes and that the closing flap is able to plug a plurality of holes simultaneously. The number of holes and/or the number of closing flaps may notably be chosen as a function of the dimensions of the microcavity.

Such a structure allows therefore, the encapsulation of one or a plurality of microelectronic devices while at the same time, avoiding the pollution of the interior of the microcavity when plugging the hole, but also to control the final atmosphere in the closed microcavity. This microcavity structure is therefore particularly suitable for the encapsulation of resonant mechanical microsystems, but also optical microsystems that are sensitive to the atmosphere in which said microsystems are placed. This structure also allows, once the cavity is closed, a pressure less than $10^{-3}$ mbar and e.g. a pressure of the order of $10^{-4}$ to $10^{-5}$ mbar, to be obtained.

The cover may comprise a second substrate, directly sealed or by a sealing cord, to the other substrate called the first substrate.

In one variant, the cover may comprise a layer of material of a thickness between about 1 μm and 10 μm The dimensions of the hole may be comprised between about 1 μm and 100 μm.

The closing flap may be placed inside the microcavity.

At least one of said two portions of materials with different thermal expansion coefficients may be a getter material, e.g. titanium and/or zirconium.

The closing flap may comprise at least three portions of materials with different thermal expansion coefficients, while the value of the thermal expansion coefficient of the material of the portion placed between the two other portions may fall between the values of the thermal expansion coefficients of the materials of said two other portions of materials. Thus, the intermediate portion located between the two other portions of materials of the flap is suitable for reducing the shear stresses in the closing flap during the deformation of the flap between a position of non-closing of the hole and a closing position of the hole (or the reverse), namely when the difference between the thermal expansion coefficients of the materials of said two other portions is larger than or equal to about $15 \times 10^{-6}$ °C.$^{-1}$.

Said at least two portions of materials with different thermal expansion coefficients may form a plurality of deformable elements, while at least a first end of each deformable element may be mechanically linked to the cover via at least one non deformable element, at least one second end of each deformable element may be free, and at least one part of each deformable element may be placed opposite at least one hole passing through the cover. The non deformable element may therefore form a reinforcing frame which, in addition, increases the mechanical strength of the cover.

The structure may include, in addition, at least one electrical contact passing through the cover and electrically linked to the closing flap.

The structure may include, in addition, at least one electrical contact passing through the microcavity from the substrate up to the cover.

The structure may include, in addition, at least one plug, plugging the hole.

Another embodiment relates to an encapsulation structure for a microelectronic device, in which the microelectronic device is placed inside the microcavity of a structure such as previously described.

It is also proposed a method for producing a microcavity structure, comprising at least the steps of:
  producing a portion of sacrificial material on a second substrate,
  producing at least two portions of materials with different thermal expansion coefficients placed one against the other and partially on the portion of sacrificial material so that at least a first end of said two portions is placed on the second substrate and at least a second end of said two portions is placed on the portion of sacrificial material,
  attachment of the second substrate to a first substrate so that a space between the second substrate and the first substrate forms the microcavity,
  producing at least one hole through the second substrate, forming an access to the portion of sacrificial material,
  elimination of the portion of the sacrificial material through the hole, said two portions of material with different thermal expansion coefficients forming a closing flap for the hole.

Said two portions may be suitable for closing or not the hole under the effect of a variation of temperature.

It is also proposed a method for producing a microcavity structure, comprising at least the steps of:
  deposition of a portion of sacrificial material on a substrate;
  shaping the layer of sacrificial material;
  producing at least two portions of materials with different thermal expansion coefficients placed one against the other on the layer of sacrificial material;
  producing one portion of sacrificial material placed in part on said two portions of materials with different thermal expansion coefficients and on the layer of sacrificial material;
  deposition of a cover layer covering the layer of sacrificial material, said two portions of materials with different thermal expansion coefficients and the portion of sacrificial material;
  producing at least one hole through the cover layer, forming an access to the portion of sacrificial material;
  elimination of the portion and of the layer of sacrificial material through the hole, forming the microcavity, said two portions of material with different thermal expansion coefficients forming a closing flap for the hole.

Said two portions may be suitable for closing or not the hole under the effect of a variation of temperature.

The step of elimination of the portion of sacrificial material, or of the portion and of the layer of sacrificial material, may be performed at a temperature such that the closing flap may be deformed in a position not closing the hole.

The method may include in addition, following the step of elimination of the portion of sacrificial material, or of the portion and of the layer of sacrificial material, a step of plugging the microcavity by the fabrication of a plug on and/or in the hole, at a temperature such that the closing flap is deformed in a position of closing the hole.

The present invention also concerns a method of encapsulation of a microelectronic device, comprising the implementation of a method of producing a microcavity structure such as described above, in which the microelectronic device has been previously placed on the substrate or the first substrate.

The method of encapsulation may be implemented in a collective fashion to produce the encapsulation of a plurality of microelectronic devices placed on the substrate. The closing flaps may also be fabricated in a collective fashion. The chips (each chip corresponds to the entire form of the microelectronic device and its encapsulation structure) may then be separated one from another by a slicing operation.

Given that the dimensions of the holes may be substantially greater than in the methods in the prior art, the speed of release of the microelectronic device, that is the speed of elimination of sacrificial material, may therefore be much greater.

The step of plugging may correspond to a step of deposition by evaporation under vacuum of the material intended to form the plug. Thus, it is possible, when at least one part of the closing flap is made of a getter material and/or when a getter material is present in the microcavity, to first activate the getter material at this closing step, notably by a heating produced in the depositing machine, thus favoring the desorption of species trapped in the microcavity. It is therefore not necessary to proceed to a thermal activation treatment of the getter material following the closing of the microcavity.

The step of sealing the microcavity may be carried out at a pressure such that the pressure in the microcavity, after closure thereof, is less than about $10^{-3}$ mbar.

BRIEF DESCRIPTION OF THE DRAWINGS

The present invention will be better understood when reading the description of given examples of embodiment, for information only and not at all limiting, making reference to the attached drawings in which.

Identical, similar or equivalent parts of the various figures described hereafter have the same numerical references so as to facilitate passing from one figure to another.

The different parts shown on the figures are not necessarily shown on a uniform scale, in order to make the figures clearer.

The different possibilities (variants and embodiments) should be understood as non-exclusive with respect to each other and can be combined one with another.

DETAILED DESCRIPTION OF PARTICULAR EMBODIMENTS

Figure 1:
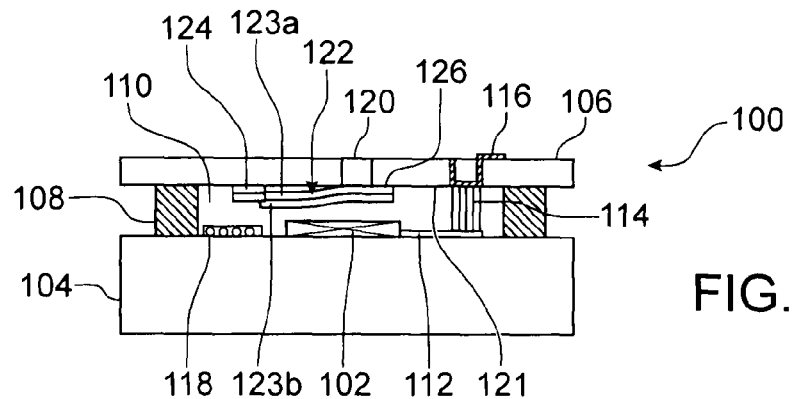
FIGS. 1, 3 and 4 show the microcavity structures serving as an encapsulation structure for a microelectronic device, respectively according to a first, a second and a third embodiment.

Reference is first made to FIG. 1 which shows a microcavity structure 100, which is here an encapsulation structure for a microelectronic device 102, e.g. of the MEMS and/or NEMS and/or MOEMS and/or NOEMS type, according to a first embodiment.

The structure 100 comprises a first layer 104, e.g. semiconductor-based, such as Si-based, on which is placed, the microelectronic device 102. The structure 100 also comprises a second substrate 106 forming a cover. The two substrates 104 and 106 are attached via a sealing cord 108, obtained, e.g. via the implementation of a eutectic metallic seal between these two substrates 104, 106. The device 102 is thus encapsulated in a microcavity 110, the walls of which are formed by the two layers 104, 106 and by the sealing cord 108. An electrical contact 112 is fabricated inside the microcavity 110 and is electrically connected to the device 102. Another electrical contact 116 crosses through the second substrate 106 and is electrically linked to the electrical contact 112 by the intermediary of a through-via 114, or a conductive stud. This other electrical contact 116 forms a via crossing through the second substrate 106. The elements 112, 114 and 116 form an electrical contact crossing through the microcavity 110 from the substrate 104 up to the second substrate 106, enabling the device 102 to be electrically connected from the outside of the microcavity 110. A getter material 118 is also placed inside the microcavity 110 in order to achieve the absorption of gases present inside the microcavity 110 and, therefore, to reduce the pressure inside the microcavity 110.

A release hole 120 is also formed through the second substrate 106. This release hole 120 is suitable, during the production of the structure 100, for removing a sacrificial material (referenced as 128 in FIGS. 2B and 2D) on which a closing flap 122 is built and/or any sacrificial material present in the microcavity 110, thus releasing the device 102 when same is built using a sacrificial material, while the latter may be different from the sacrificial material used for the fabrication of the flap 122. In a variant, it is possible that a plurality of release holes is produced through the second substrate 106.

The closing flap 122 is placed at the level of a side 121 of the second substrate 106 which is located inside the microcavity 110, opposite a release hole 120. Even if only one closing flap 122 is shown in FIG. 1, the encapsulation structure 100 may comprise a plurality of closing flaps when a plurality of release holes are formed through the second substrate 106. In this case, it is also possible that one or more closing flaps each serve for closing one or more release holes made close to each other.

The closing flap 122 is here formed by a stack of two portions 123a, 123b of materials which have different thermal expansion coefficients. In the example in FIG. 1, the closing flap 122 is formed by an upper metallic portion 123a and a lower metallic portion 123b. The closing flap 122 is mechanically linked to the second substrate 106 at the level of a first end 124 of the two portions 123a, 123b. These two portions 123a, 123b also comprise a second end 126, which is free.

Thus, taking into account the fact that the portions 123a, 123b are made of materials (here metals) with different thermal expansion coefficients, the closing flap 122 therefore forms a bimetallic strip capable of deforming when subjected to certain temperatures. Depending upon the temperature that the closing flap 122 is subjected to, same can be deformed by flexing, moving the free end 126 up or down, i.e. in a position which closes or opens the hole 120. In the example in FIG. 1, the free end 126 is in its upper position, the flap 122 thus ensuring the closing of the hole 120. This position corresponds to the position of the closing flap 122 when it is not stressed, i.e. at ambient temperature.

The direction of actuation of the closing flap 122 can be adjusted by playing with the thermal expansion coefficients of the metallic portions 123a, 123b of the flap 122, but also on the residual stresses undergone by the portions 123a, 123b of the closing flap 122 after same are fabricated. Indeed, the residual stresses may be such that the closing flap 122 is flexed towards the top of the microcavity 110, i.e. towards the second substrate 106, when it is released from the sacrificial material present in the microcavity 110 and placed at ambient temperature, as shown in FIG. 1. In addition, depending upon the intensity of these residual stresses, the closing may be hermetical or not. When the flap 122 closes the hole 120, it is possible to hermetically plug the microcavity 110 by depositing a plugging material on the second substrate 106, at the level of the release hole 120, and/or in the release hole 120.

Reference is made now to FIGS. 2A to 2F which show the steps of a method of fabrication of the structure 100, corresponding to method of encapsulation for the microelectronic device 102.

Figure 2A:
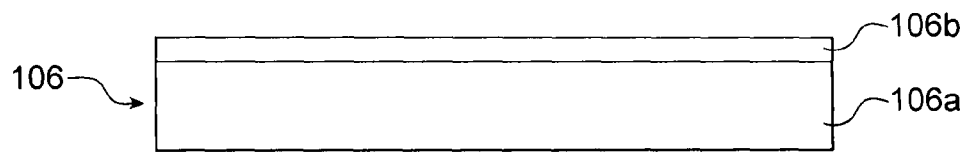
FIGS. 2A, 2B, 2C, 2D, 2E and 2F show the stages of a method of producing a microcavity structure corresponding to a method of encapsulation for a microelectronic device, according to the first embodiment.
Figure 2B:
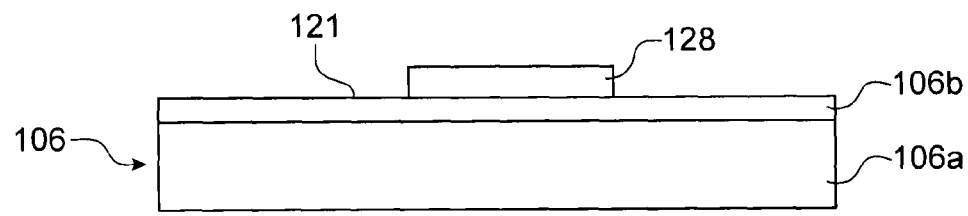

As shown in FIG. 2A, the second substrate 106 is first fabricated by depositing a dielectric layer 106b, e.g. SiO$_2$-based, on a semiconductor-based layer 106a, e.g. silicon-based.

A sacrificial layer, e.g. resin-based, is then deposited on the side 121 of the second substrate 106. This sacrificial layer is shaped by photolithography, etching and possibly creeping, forming a portion 128 of sacrificial material, e.g. resin (see FIG. 2B).

Figure 2C:
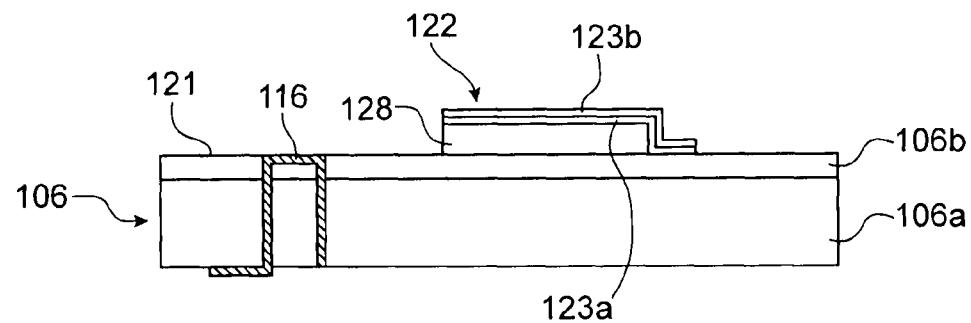
Figure 2D:
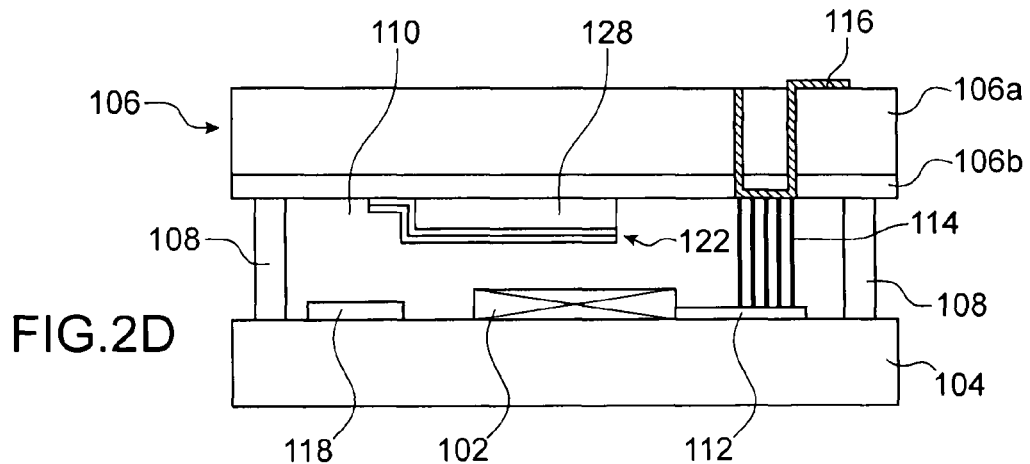

As shown in FIG. 2C, the closing flap 122 is fabricated by depositing a first metal-based layer of the portion 123a and by etching this first layer in order to form the portion 123a. A second metallic layer is then deposited and etched in order to form the portion 123b. In the example described here, the coefficient of thermal expansion of the metal of the portion 123a is smaller than the coefficient of thermal expansion of the metal of the portion 123b. The electrical contact 116 is also fabricated through the second substrate 106.

The attachment of the second substrate 106 to the first substrate 104 is made via the sealing cord 108 obtained, e.g. by the implementation of a eutectic metallic seal. In this embodiment, the via 114 which electrically links the contacts 112 and 116 is also fabricated, e.g. from the same material as the material used for fabricating the sealing cord 108. A thinning down of the layer 106a of the second layer 106 (FIG. 2D) is then carried out.

Figure 2E:
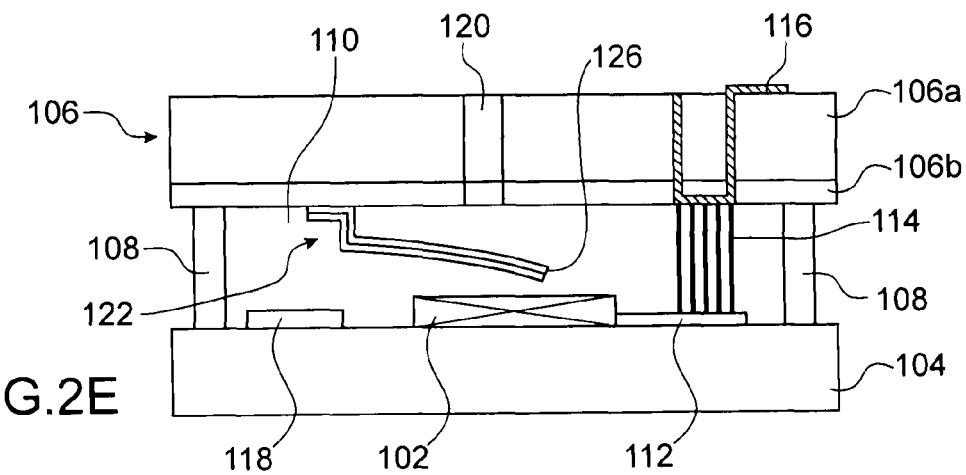

The release hole 120 is then fabricated, using photolithography and etching through a second substrate 106. The closing flap 122 is then released by etching the resin portion 128 with a dry etching and at a temperature such that the free end 126 of the flap 122 flexes downward, toward the microelectronic device 102 (FIG. 2E). In this position, the flap 122 does not close the hole 120.

Figure 2F:
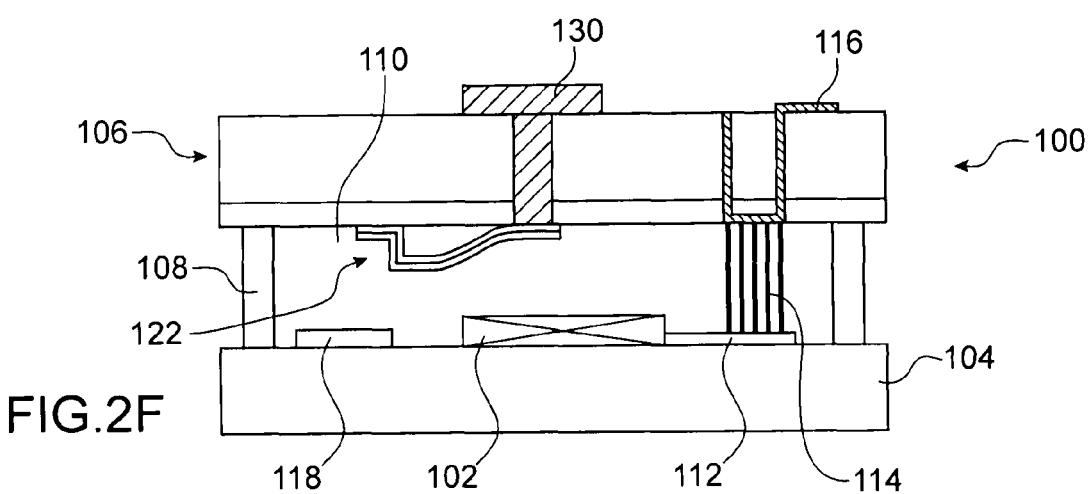

Finally, as shown in FIG. 2F, the structure 100 is brought to ambient temperature. The closing flap 122 then close the access to the microcavity 110 formed by the hole 120, the free end 126 flexing upwards (towards the second substrate 106). The plugging of the hole 120 is then carried out, via a metallic deposition 130, e.g. of PVD type (physical deposition in vapor phase), namely inside the hole 120.

The plugging of the release hole 120 is obtained via a deposition, advantageously quite directional and of metallic type, onto the second substrate 106, at the level of the release hole 120. E.g. a metallic deposition using PVD is thus suitable for hermetically closing the microcavity 110. In addition, depending upon the pressure associated with the PVD-type deposition, it is possible to control the residual pressure present in the microcavity 110 after the hermetical closing of same. Thus, it is possible to produce a deposition, via evaporation under high vacuum, of the plug 130, which is suitable for obtaining, inside the microcavity, a level of the final vacuum smaller than same obtained by a sputtering method. This latter embodiment is suitable for possibly controlling the partial pressure of a rare gas (argon, krypton) introduced during the deposition process since this gas is not absorbed by the getter materials.

In the example of fabrication previously described in relation to FIG. 1 and FIGS. 2A to 2F, the getter material 118 is present inside the microcavity 110 beside the electronic device 102. When this getter material is not present inside the microcavity 110, or when a significant gaseous absorption is desired, the closing flap 122 may comprise at least one of the metallic portions 123a or 123b thereof, preferably at least the portion opposite the device 102 (i.e. the lower portion 123b in the example in FIG. 1), made of a metal with a getter effect, thus contributing to the management of the final pressure inside the microcavity 110 which encloses the device 102. As an example, a method of closing using PVD deposition of a plugging material via evaporation under vacuum will enable, initially, and under the action of the temperature rise, the closing flap 122 to flex towards the bottom of the microcavity 110, i.e. towards the device 102, thus favoring the evacuation of degassed species from the microcavity 110. After cooling, the closing flap 122 can flex upwards, towards the release hole 120, thus favoring the closing of the release hole 120 via a deposition at ambient temperature. In addition, under the action of temperature and secondary vacuum, the getter material (of the flap 122 and/or of the portion 118) will then be activated without a supplementary activation step being required after the plugging of the release hole 120.

The calculation of the dimensions of the closing flap 122 may be carried out as described in the document "Pyromètres à bilames" by J. Jouanneau, Techniques de l'Ingénieur, R 2540-1 to R 2540-10, which is summarized below:

the analytical expression of the shift D of the free end 126 of the flap 122 can be obtained from the following equations:

$$V = 3/2.(\alpha_2 - \alpha_1).(1+(E_1.e_1^2 - E_2.e_2^2)^2 / 4.E_1.e_1.E_2.e_2.e^2)^{-1} \quad (1)$$

$$V/2 = D.e/((L^2 + D^2 - D.e).(T - T_0)) \quad (2)$$

$$e = e_1 + e_2 \quad (3)$$

With:

$E_i$, $\alpha_i$, $e_i$: respectively the Young's modulus (MPa), the thermal expansion coefficient (° C.$^{-1}$) and the thickness (in m) of the $i^{th}$ metallic layer of the flap 122, L: the length of the flap 122 (m), $T_0$: the temperature (° C.) at which the flap 122 is horizontal, T: the actuation temperature (° C.) of actuating the flap 122.

The following table shows a plurality of metals which can be used for fabricating the portions 123a, 123b of the closing flap 122, as well as the values for the thermal expansion coefficients and for the Young's modulus of these materials:

| Metal | $\alpha$ (10$^{-6}$/° C.) | E (GPa) |
|---|---|---|
| Al | 23.1 | 70 |
| Cu | 16.5 | 130 |
| Ni | 13.4 | 200 |
| Pt | 8.8 | 168 |
| Ti | 8.6 | 116 |
| Zr | 5.7 | 68 |

In order that the closing flap 122 moves downwards (towards the device 120) during a temperature rise, the metal of the upper portion 123a of the flap 122, i.e. the portion which is on the side of the second substrate 106, must have a coefficient of thermal expansion larger than same of the metal of the portion on the side of the device 102 (lower portion 123b in the example in FIG. 1). In addition, it is possible to produce closing flaps 122 with a getter effect by fabricating the upper layer 123a from aluminum and/or copper and/or nickel and/or platinum, and the lower layer 123b from titanium and/or zirconium (titanium and zirconium being metals with a getter effect).

Figure 3:
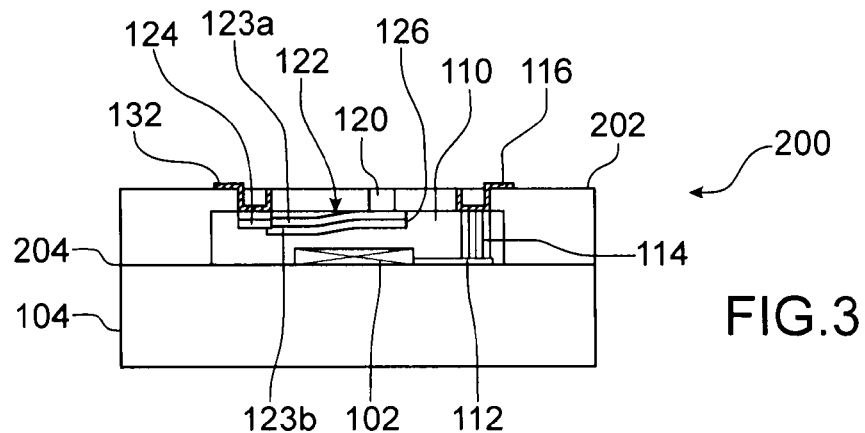

Reference is made to FIG. 3 which shows a microcavity structure 200, serving as an encapsulation structure for the microelectronic device 102, according to a second embodiment.

With respect to the encapsulation structure 100 shown in FIG. 1, the structure 200 comprises a second substrate 202, e.g. made of a semiconductor, such as silicon, forming a cover and attached to the first substrate 104 by direct sealing at the level of the interface 204. In this second embodiment, the structure 200 does not comprise a sealing cord between the two substrates 104, 202. In addition, in this second embodiment, the getter material 118 is not present inside the microcavity 110. The fixed end 124 of the closing flap 122 is electrically linked to an electrical contact 132. Thus the closing flap 122 may be actuated by heating using the Joule effect, obtained by intermediary of an electrical current applied to the electrical contact 132. In addition, when the closing flap 122 comprises one of these portions 123a, 123b composed of a getter material, the Joule effect enables a thermal activation of this getter material to be produced.

The method of fabrication for this structure 200 is similar to same for the structure 100, with the exception of the attachment of the second substrate 202 to the first substrate 104 which is carried out here by a direct sealing between the two substrates 104, 202.

Figure 4:
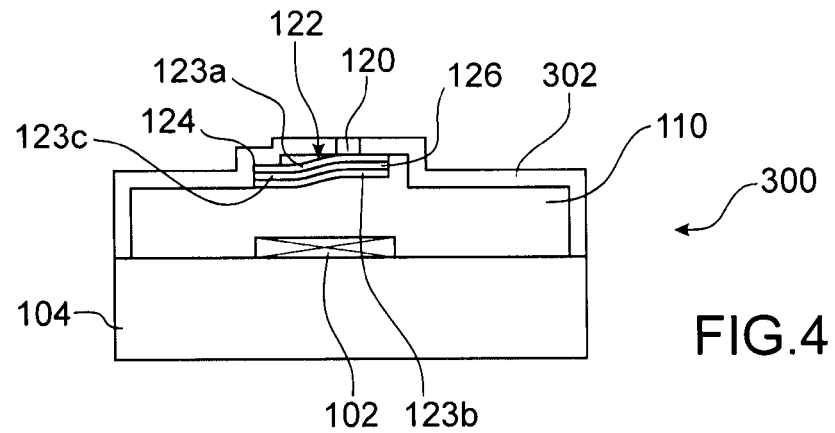

A microcavity structure 300, forming an encapsulation structure of the microelectronic device 102, according to a third embodiment, is shown in FIG. 4.

With respect to the encapsulation structures 100 and 200 previously described in relation to FIGS. 1 and 3, the cover of the microcavity 110 is not fabricated by attaching two substrates to each other, but is formed by a thin layer 302 to which the closing flap 122 is mechanically linked. This thin layer 302 is, e.g. oxide-based, e.g. $SiO_2$, and/or nitride based, e.g. SiN. In addition, the closing flap 122 is here formed by a stack of three portions 123a, 123b and 123c of materials which have different thermal expansion coefficients from one another. Thus, the material of the portion 123c placed between the two portions 123a and 123b has a thermal expansion coefficient larger than same of the material of the portion 123b, which is located on the side of the device 102, and smaller than same of the material of the portion 123a, which is located on the side of the release hole 120. The intermediate portion 123c enables the shearing effects, which can occur during the deformation of the flap 122, to be reduced.

Reference is made to FIG. 5A to 5F which show the steps of the method of producing the microcavity structure 300.

Figure 5A:
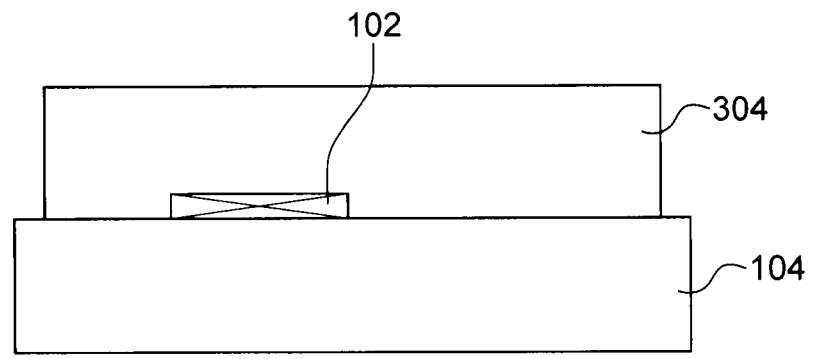
FIGS. 5A, 5B, 5C, 5D, 5E, and 5F show the stages of a method of producing a microcavity structure corresponding to a method of encapsulation for a microelectronic device, according to the third embodiment.

As shown in FIG. 5A, the deposition of a sacrificial layer 304 on the substrate 104 is first carried out, covering the microelectronic device 102 placed on the substrate 104. The microelectronic device 102 may be fabricated according to methods using sacrificial materials which can be etched at the same time or after the sacrificial layer 304. This sacrificial layer 304 is made of, e.g. photosensitive resin, e.g. a resin with positive polarity or polyimide. The sacrificial layer 304 is then shaped via photolithography and etching so that the volume of same corresponds to a part of the volume of the future microcavity 110 of the structure 300. The sacrificial layer 304 also undergoes a thermal treatment to become able to undergo the steps of the process that follow.

Figure 5B:
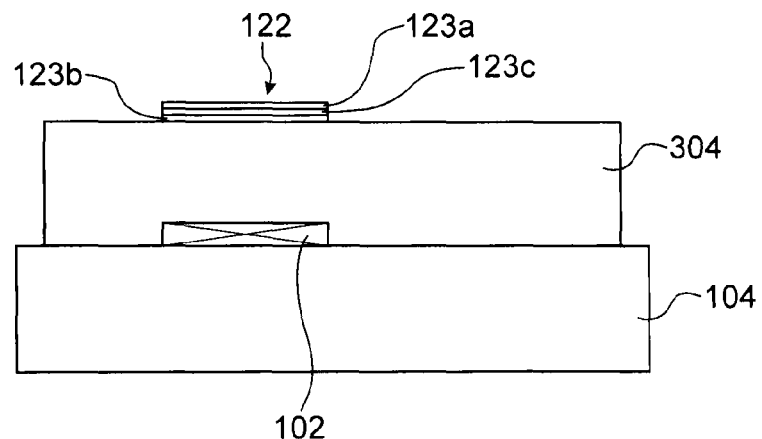

Then, a stack of three metallic layers is deposited, intended to form, after shaping via photolithography and etching, the metallic portions 123a, 123b, 123c of the flap 122 (FIG. 5B).

Figure 5C:
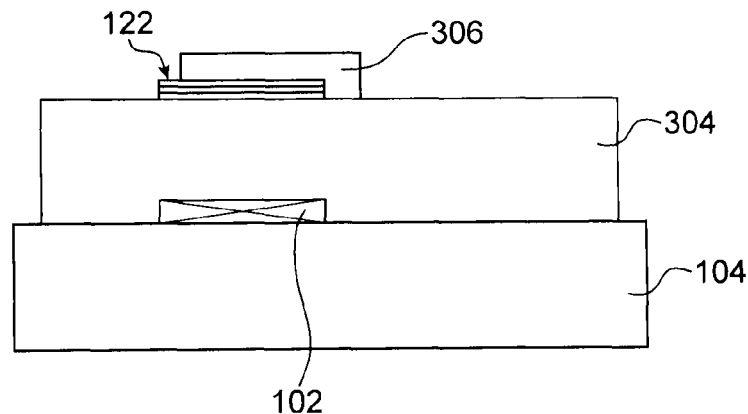

As shown in FIG. 5C, a second layer of sacrificial material 306 is deposited, then shaped via photolithography and etching in order to form a sacrificial portion 306 intended to form a part of the microcavity 110 in which the flap 122 will deform and close the release hole 120. The sacrificial portion 306 is made, e.g. of the same material as that used for the sacrificial layer 304.

Figure 5D:
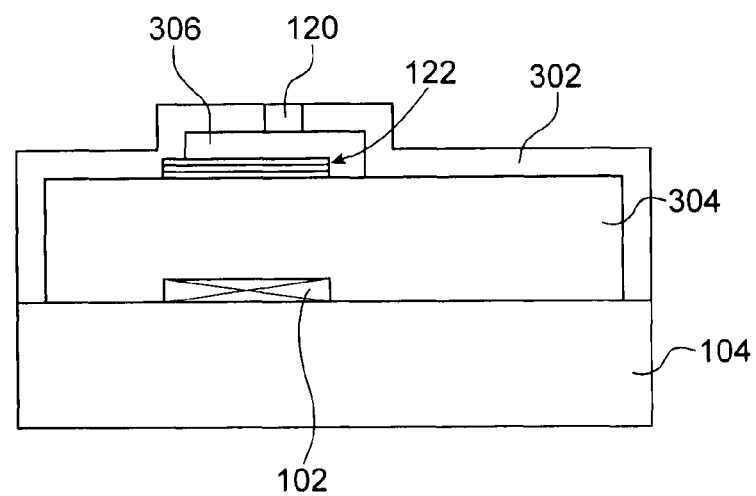

The thin layer 302, intended to form the cover of the structure 300, is then deposited in order to cover the sacrificial layer 304, the flap 122 and the sacrificial portion 306. The release hole 120 is also produced via photolithography and etching through the cover layer 302 (FIG. 5D). It would also be possible, at this stage of the process, to produce other holes through the cover layer 302 in order to arrive at electrical vias connected to the microelectronic device 102. These vias could be made prior to the deposition of the sacrificial layer 304 on the substrate 104, and raised from the substrate 104 towards the cover layer 302 to mechanically support the cover layer 302.

Figure 5E:
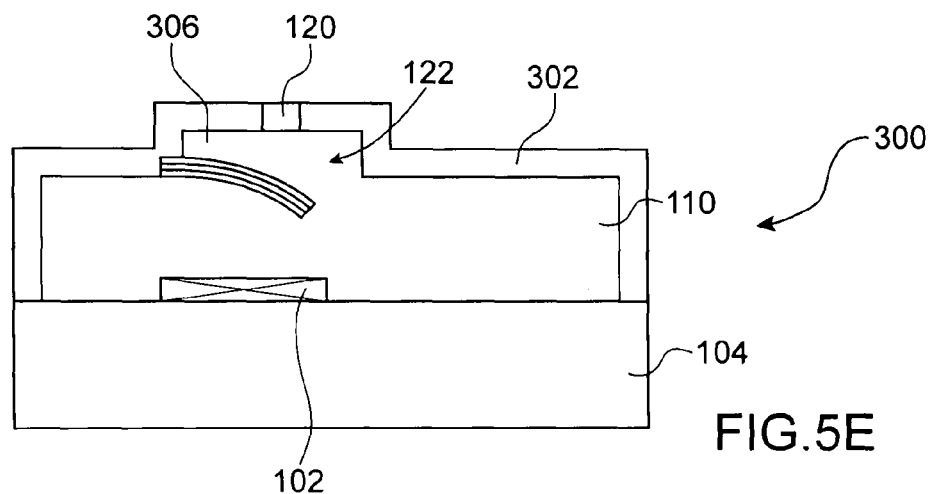

As shown in FIG. 5E, the closing flap 122 is then released by etching the sacrificial portion 306 and the sacrificial layer 304. The temperature during this etching is such that the flap is flexed downwards (towards the device 102 placed on the bottom of the microcavity 110).

Figure 5F:
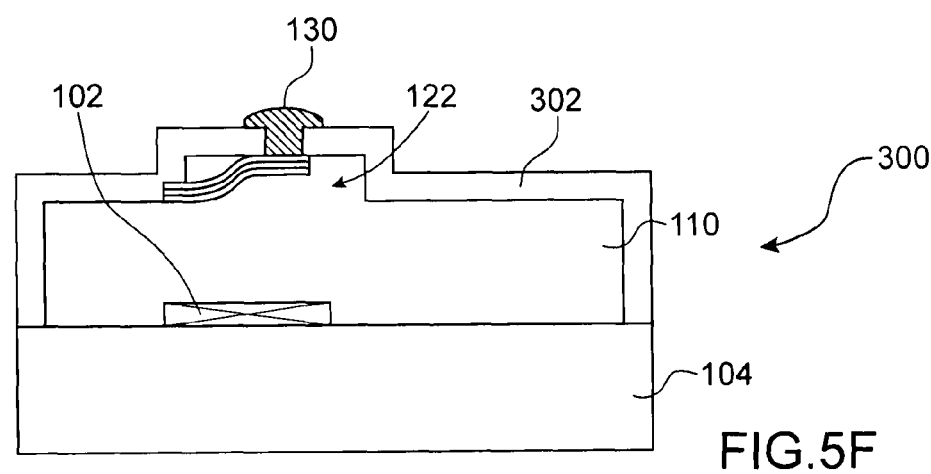

Finally, after returning to ambient temperature, the flap 122 then moves into the closing position for the hole 120, which enables the plugging of the hole to be carried out, using the plug 130, without polluting the inside of the microcavity 110 (FIG. 5F).

Figure 6:
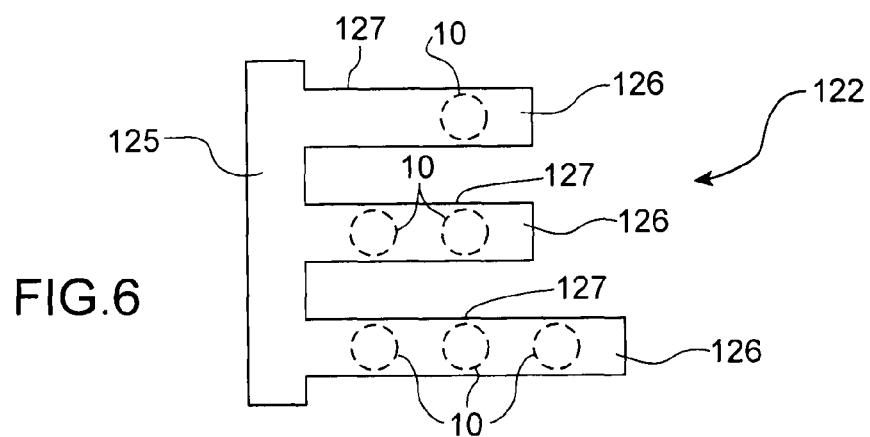
FIG. 6 show an example of a closing flap for a microcavity structure.

In the examples previously described, the flap 122 comprises only one deformable element formed by the stacking of portions 123a, 123b and possibly 123c. In one variant, it is possible that the closing flap comprises a plurality of deformable elements, distinct from each other. Such a flap 122 is shown in the FIG. 6. In this example, the flap 122 comprises a plurality of deformable elements 127 formed by portions of materials similar to the portions 123a, 123b (and possibly 123c) of the previously described flaps. Dotted circles 10 symbolically show holes which could be closed by different deformable elements 127. It can be seen, therefore, that each deformable element 127 can close a different number of holes. In addition, the flap 122 includes a reinforcing frame 125 to which all deformable elements 127 are linked and which forms a fixed end of the flap 122. Such a reinforcing frame 125 will, in addition, enable the cover of the microcavity to be mechanically consolidated. Finally, each of the deformable elements 127 includes a free end 126 which will not be mechanically linked to the cover of the microcavity structure.

It is possible to evaluate analytically the advantages of the use of the closing flap 122 during the release of the device 102 with respect to the encapsulation method according to the prior art as previously described. Indeed, let us call:

d, the diameter of the release hole fabricated during the process of the prior art, n, the number of release holes fabricated during the process of the prior art, $d_t$, the diameter of a release hole 120, x, the distance from the center of the hole 120 with respect to the embedded end 124 of the flap 122 and depending upon the length L of the flap 122, D the shift of the free end 126 of the flap 122.

By making the approximation of a linear deformation of the flap 122, the ratio between the release surfaces calculated according to the prior art and one of the structures 100, 200 or 300, enables the number n of equivalent holes to be defined by the following expression:

$$n=4.x.D.d_i/(L.d^2) \quad (4)$$

In the case of a flap located directly above a set of k release holes with diameter $d_i$ and with coordinates $x_j$, the formula becomes:

$$n=4.(x_1+x_2+\ldots+x_k).D.d_i/(L.d^2) \quad (5)$$

In the case of a set of k identical bimetals and each located directly above a release hole with diameter $d_i$ the equation becomes:

$$n=4.x.D.d_i/(L.d^2) \quad (6)$$

Depending upon the device to be encapsulated and the dimensions of the microcavity, it is therefore possible to combine flaps with different geometries and, therefore, combine equations 5 and 6.

As a numerical application, the equations have been solved for the case of a flap 122 with a length equal to 100 μm, with width equal to 30 μm, constituted of nickel-based and titanium-based portions 123a, 123b. The thickness of each portion 123a, 123b is equal to 0.5 μm. The diameter of the release hole 120 is equal to 20 μm. The value of x is 70 μm and the value of d is 3 μm. The variation of temperature is 100° C. In this case, n is about 21.

The invention claimed is:

1. A microcavity structure comprising at least:
a first substrate,
a cover attached to the first substrate such that a space formed between the cover and the first substrate forms the microcavity,
at least one hole passing through the cover, and
at least one closing flap of the hole placed inside the microcavity and comprising at least two portions of materials with different thermal expansion coefficients placed one against the other, at least one first end of said two portions being mechanically linked to the cover, at least a second end of said two portions being free, and at least a part of the closing flap being placed opposite the hole, said two portions being capable of closing or not the hole under an effect of a temperature variation.

2. The structure according to claim 1, in which the cover comprises a second substrate attached directly, or via a sealing cord, to the first substrate.

3. The structure according to claim 1, in which the cover comprises a layer of material with thickness comprised between about 1 micrometer and 10 micrometers.

4. The structure according to claim 1, in which dimensions of the hole are comprised between about 1 micrometer and 100 micrometers.

5. The structure according to claim 1, in which at least one of said two portions of materials with different thermal expansion coefficients is made of a getter material.

6. The structure according to claim 1, in which the closing flap comprises at least three portions of materials with different thermal expansion coefficients, a value of the thermal expansion coefficient of the material of the portion placed between the two other portions falling between values of thermal expansion coefficients of the materials of said two other portions of materials.

7. The structure according to claim 1, in which said at least two portions of materials with different thermal expansion coefficients form a plurality of deformable elements, at least a first end of each deformable element being mechanically linked to the cover via at least one non deformable element, at least a second end of each deformable element being free, and at least a part of each of said deformable elements being placed opposite the at least one hole passing through the cover.

8. The structure according to claim 1, comprising, in addition, at least one electrical contact passing through the cover and electrically linked to the closing flap.

9. The structure according to claim 1, comprising, in addition, at least one electrical contact passing through the microcavity from the first substrate to the cover.

10. The structure according to claim 1, comprising, in addition, at least one plug that plugs the hole.

11. An encapsulation structure for a microelectronic device, in which the microelectronic device is placed inside the microcavity of the structure according to claim 1.

12. A method for producing a microcavity structure, comprising at least the steps of:
producing a portion of sacrificial material on a second substrate;
producing at least two portions of materials with different thermal expansion coefficients placed one against the other and partially on the portion of sacrificial material so that at least a first end of said two portions is placed on the second substrate and at least a second end of said two portions is placed on the portion of sacrificial material;
attaching the second substrate to a first substrate so that a space between the second substrate and the first substrate forms the microcavity;
producing at least one hole through the second substrate, forming an access to the portion of sacrificial material;
eliminating the portion of sacrificial material through the hole, said two portions of materials with different thermal expansion coefficients forming a closing flap of the hole so that said two portions are capable of closing or not the hole under an effect of a temperature variation.

13. The method according to claim 12, in which the step of eliminating the portion of sacrificial material is performed at a temperature such that the closing flap is deformed in a position which does not close the hole.

14. The method according to claim 12, comprising, in addition, following the step of eliminating the portion of sacrificial material, a step of plugging the microcavity by at least one of fabricating a plug on or in the hole at a temperature such that the closing flap is deformed in a position of closing the hole.

15. A method for producing a microcavity structure, comprising at least the steps of:
depositing a layer of sacrificial material on a first substrate;
shaping the layer of sacrificial material;
producing at least two portions of materials with different thermal expansion coefficients placed one against the other on the layer of sacrificial material;
producing a portion of sacrificial material placed, in part, on said two portions of materials with different thermal expansion coefficients and on the layer of sacrificial material;

depositing a cover layer covering the layer of sacrificial material, said two portions of materials with different thermal expansion coefficients and the portion of the sacrificial material;

producing at least one hole through the cover layer, forming an access to the portion of sacrificial material; and eliminating the portion of sacrificial material and the layer of sacrificial material through the hole, forming the microcavity, said two portions of materials with different thermal expansion coefficients forming a closing flap of the hole so that said two portions are capable of closing or not the hole under an effect of a temperature variation.

16. An encapsulation method of a microelectronic device, comprising:

implementing the method of producing a microcavity structure according to claim 12 or 15 and placing the microelectronic device on the first substrate.

17. The method according to claim 16, in which the step of eliminating the portion of sacrificial material and the layer of sacrificial material is performed at a temperature such that the closing flap is deformed in a position which does not close the hole.

18. The method according to claim 16, further comprising, after the step of eliminating the portion of sacrificial material and the layer of sacrificial material, a step of plugging the microcavity by at least one of fabricating a plug on or in the hole at a temperature such that the closing flap is deformed in a position of closing the hole.

* * * * *